United States Patent
Yoshimi et al.

(10) Patent No.: US 6,187,150 B1
(45) Date of Patent: Feb. 13, 2001

(54) METHOD FOR MANUFACTURING THIN FILM PHOTOVOLTAIC DEVICE

(75) Inventors: Masashi Yoshimi; Kenji Yamamoto, both of Kobe (JP)

(73) Assignee: Kaneka Corporation, Osaka (JP)

(*) Notice: Under 35 U.S.C. 154(b), the term of this patent shall be extended for 0 days.

(21) Appl. No.: 09/414,092

(22) Filed: Oct. 7, 1999

(30) Foreign Application Priority Data

Feb. 26, 1999 (JP) .................................................. 11-050587

(51) Int. Cl.⁷ .......................... C23C 14/08; C23C 14/34; H01L 31/04
(52) U.S. Cl. ................................ 204/192.29; 204/192.15; 204/192.17; 204/192.13; 136/252; 136/256; 136/258; 136/265; 438/57; 438/85; 438/96; 438/98
(58) Field of Search .................... 204/192.15, 192.29, 204/192.17, 192.13; 136/252, 256, 258 AM, 265; 438/57, 85, 96, 98

(56) References Cited

U.S. PATENT DOCUMENTS

| | | | |
|---|---|---|---|
| 4,428,810 | * | 1/1984 | Webb et al. .................... 204/192.29 |
| 5,078,803 | * | 1/1992 | Pier et al. ............................ 136/265 |
| 5,078,804 | * | 1/1992 | Chen et al. ......................... 136/265 |
| 5,116,479 | * | 5/1992 | Nakamura et al. ............. 204/192.29 |
| 5,578,501 | * | 11/1996 | Niwa ................................. 204/192.29 |
| 5,605,610 | * | 2/1997 | Ishibashi ......................... 204/192.29 |
| 6,040,521 | * | 3/2000 | Kushiya et al. ................ 204/192.29 |

FOREIGN PATENT DOCUMENTS

| | | |
|---|---|---|
| 5-13789 | 1/1993 | (JP) . |
| 5-82814 | 4/1993 | (JP) . |
| 5-82815 | 4/1993 | (JP) . |

* cited by examiner

*Primary Examiner*—Alan Diamond
(74) *Attorney, Agent, or Firm*—Hogan Hartson, LLP.

(57) ABSTRACT

A method for manufacturing a thin film photovoltaic device comprising a transparent conductive film, a thin film photovoltaic unit, and a back transparent conductive film and a back metal electrode which are successively formed on a substrate, wherein the back transparent conductive film is formed by sputtering comprising steps of forming an initial back transparent conductive film under a pressure of $5 \times 10^{-2}$ Torr or more for 1 to 30 seconds in the initial stage and forming a main back transparent conductive film having the remainder thickness under a pressure reduced to $\frac{1}{10}$ the initial pressure or less.

13 Claims, 1 Drawing Sheet

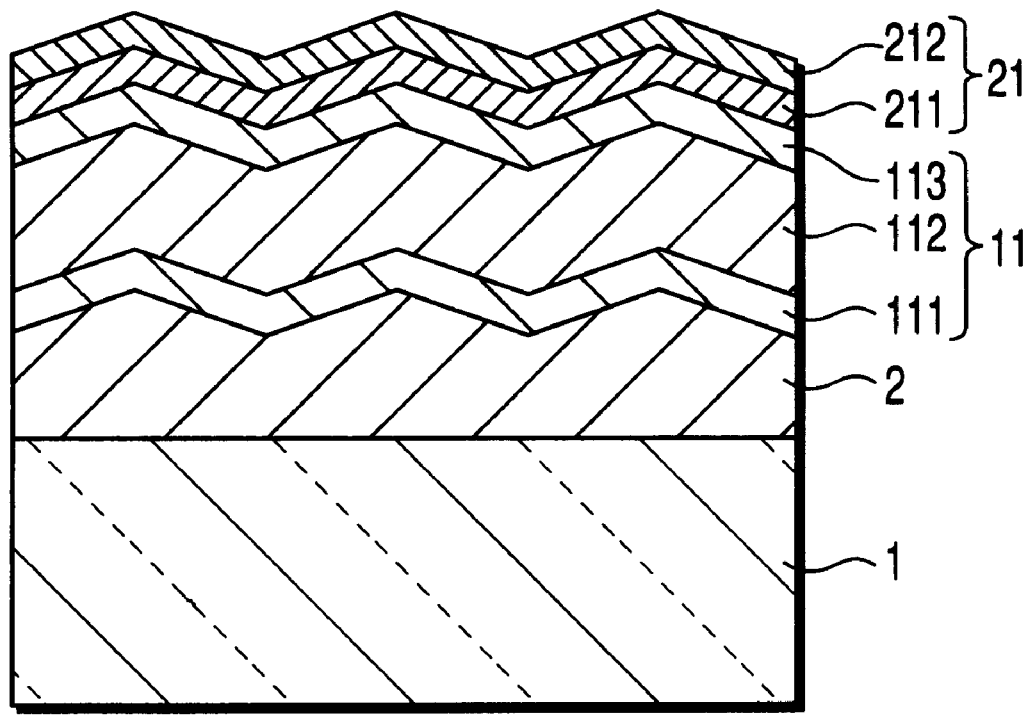
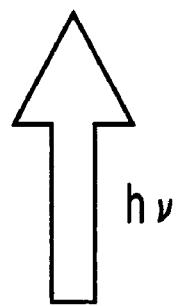
FIGURE

METHOD FOR MANUFACTURING THIN FILM PHOTOVOLTAIC DEVICE

BACKGROUND OF THE INVENTION

The present invention relates to a method for manufacturing a thin film photovoltaic device, and, particularly, to a method for improving the performance of a thin film photovoltaic device. It should be noted that in the present specification the terms "crystalline" and "microcrystalline" are intended to also mean partially amorphous material.

In recent years, photovoltaic devices using a semiconductor thin film have been developed extensively. The object of the development of these photovoltaic devices is to obtain a high quality semiconductor thin film formed on an inexpensive substrate in a low temperature process which affords the compatibility of low manufacturing costs with a high performance. Such a photovoltaic device is expected to be used in various applications such as solar cells and photo-sensors.

As an example of the photovoltaic device, a device in which a transparent conductive film, a thin film photovoltaic unit, a back transparent conductive film and a back metal electrode are successively laminated on a substrate has been known. The back transparent conductive film arranged between the thin film photovoltaic unit and the back metal electrode is formed to remove thermal strain caused by a difference in the coefficient of thermal expansion between the semiconductor thin film and the metal electrode thereby increasing the adhesion strength of the metal electrode to the thin film photovoltaic unit. Further the back transparent conductive film is formed also to prevent metal atoms of the metal electrode from diffusing into the photovoltaic unit. It is generally required for this back transparent conductive film to have a thickness of 10 nm to 1 $\mu$M with high transmittance and a low resistance as low as $1.5 \times 10^{-3}$ $\Omega$cm or less.

Conventionally, the back transparent conductive film which meets such requirements has been formed, for example, by sputtering under conditions of a pressure of $2 \times 10^{-2}$ Torr or less, a substrate temperature of 100 to 450° C. and a discharge power of 500 to 1500 mW/cm$^2$.

However, it has been found that the resulting photovoltaic device is not sufficiently improved in the photovoltaic characteristics when the back transparent conductive film is formed under the sputtering conditions as aforementioned.

BRIEF SUMMARY OF THE INVENTION

An object of the present invention is to provide a method for easily manufacturing a thin film photovoltaic device improved in photovoltaic characteristics.

The present inventors have made it clear that if the back transparent conductive film is formed under the above described conventionally used sputtering conditions, the photovoltaic unit is damaged by negative ions (e.g., O$^-$) produced during sputtering. Specifically, the surface of the photovoltaic unit is oxidized with the result that the photovoltaic characteristics of the resulting photovoltaic device cannot be sufficiently improved.

The present inventors have found that excellent photovoltaic characteristics can be obtained if the back transparent conductive film is formed on the photovoltaic unit by sputtering comprising steps of forming an initial thin back transparent conductive film under a low damage condition only at the initial stage and thereafter forming a main back transparent conductive film with the remainder thickness under conditions ensuring that a high quality film is obtained.

According to a first aspect of the present invention, there is provided a method for manufacturing a thin film photovoltaic device comprising a transparent conductive film, a thin film photovoltaic unit, and a back transparent conductive film and a back metal electrode which are successively formed on a substrate, wherein the back transparent conductive film is formed by sputtering comprising steps of forming an initial back transparent conductive film under a pressure of $5 \times 10^{-2}$ Torr or more for 1 to 30 seconds in the initial stage and forming a main back transparent conductive film having the remainder thickness under a pressure reduced to $\frac{1}{10}$ the initial pressure or less.

According to a second aspect of the present invention, there is provided a method for manufacturing a thin film photovoltaic device comprising a transparent conductive film, a thin film photovoltaic unit, and a back transparent conductive film and a back metal electrode which are successively formed on a substrate, wherein the back transparent conductive film is formed by sputtering comprising steps of forming an initial back transparent conductive film at a discharge power of 80 to 500 mW/cm$^2$ for 1 to 30 seconds in the initial stage and forming a main back transparent conductive film having the remainder thickness at a discharge power increased to 4 times the initial discharge power or more.

According to a third aspect of the present invention, there is provided a method for manufacturing a thin film photovoltaic device comprising a transparent conductive film, a thin film photovoltaic unit, and a back transparent conductive film and a back metal electrode which are successively formed on a substrate, wherein the back transparent conductive film is formed by sputtering comprising steps of forming an initial back transparent conductive film at a temperature of 100° C. or less for 1 to 30 seconds in the initial stage and forming a main back transparent conductive film having the remainder thickness at a temperature of 100° C. or more.

In the present invention, although a material of the back transparent conductive film is not particularly limited as long as it is a transparent conductive oxide (TCO), it is preferable to use a film comprising primarily ZnO.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWING

The accompanying drawing, which is incorporated in and constitute a part of the specification, illustrates presently preferred embodiments of the invention, and together with the general description given above and the detailed description of the preferred embodiments given below, serve to explain the principles of the invention.

FIGURE is a sectional view showing an embodiment of a silicon-based thin film photovoltaic device according to the present invention.

DETAILED DESCRIPTION OF THE INVENTION

In the present invention, examples of the photovoltaic unit include a photovoltaic unit containing an amorphous silicon-based photovoltaic layer, a photovoltaic unit containing a crystalline silicon-based photovoltaic layer, a tandem-type photovoltaic unit produced by laminating one or more amorphous silicon-based photovoltaic layers and one or more crystalline silicon-based photovoltaic layers, a photovoltaic unit containing a CdS/CdTe-based photovoltaic layer and a photovoltaic unit containing a $CuInS_2$-based photovoltaic layer. The present invention will be hereinafter explained in more detail with the silicon-based thin film photovoltaic unit as an example.

An embodiment of a silicon-based thin film photovoltaic device according to the present invention will be explained with reference to a sectional view shown in FIGURE. The silicon-based thin film photovoltaic device has a structure in which a transparent conductive film 2, a photo-voltaic unit consisting of first conductivity-type layer (e.g., a p-type layer) 111, a photoelectric conversion layer 112 comprising substantially an intrinsic semiconductor, and an opposite conductivity-type (e.g., an n-type layer) 113 and a composite electrode 21 consisting of a back transparent conductive film 211 and a back metal electrode 212 are successively laminated on a substrate 1. A light hv to be subjected to photoelectric conversion is introduced from the side of the substrate 1.

The substrate 1 can be a transparent substrate made of, for example, an organic film, ceramics, or an inexpensive glass having low melting point.

The transparent conductive film 2 disposed on the substrate 1 can be a transparent conductive film containing one or more layers of compounds selected from the group consisting of ITO, $SnO_2$ and ZnO. Among these compounds, $SnO_2$ is particularly preferable in view of transparency, conductivity and chemical stability. ITO is also preferable in view of processability, conductivity and transmittance. The transparent conductive film can be formed on the substrate 1 by vacuum deposition, thermal CVD or sputtering.

The photovoltaic unit 11 is then formed on the transparent conductive film 2. The photovoltaic unit 11 may be either an amorphous silicon-based or a crystalline (polycrystalline or microcrystalline) silicon-based. Incidentally, FIGURE shows an example in which the photovoltaic unit 11 of an amorphous silicon-based is formed. All semi-conductor layers in the photovoltaic unit 11 can be deposited by a plasma CVD method in which the substrate temperature is set at 400° C. or less. As the plasma CVD method, a generally well-known parallel plate type 13.56 MHz RF plasma CVD method or a plasma CVD method making use of a high frequency power source ranging from the RF zone frequency of 150 MHz or less to the VHF zone may be used.

The photovoltaic unit 11 comprises the first conductivity-type layer 111, the photoelectric conversion layer 112 and the opposite conductivity-type layer 113. The first conductivity-type layer 111 may be either a p-type layer or an n-type layer. Corresponding to this, the opposite conductivity-type layer 113 may be an n-type layer or a p-type layer. The photoelectric conversion layer 112 comprises substantially a non-doped intrinsic semiconductor. It is noted that a p-type layer is generally disposed on the incident side of light on a photovoltaic device and hence the first conductivity-type layer 111 is a p-type layer and the opposite conductivity-type layer 113 is an n-type layer in the structure shown in FIGURE.

The first conductivity-type layer 111 comprises a p-type silicon thin film which is doped with, for example, boron as an conductivity-type determining impurity. However, there is no limitation to the impurity, and aluminum may be used in the case of a p-type layer. As a material for the first conductivity-type layer 111, amorphous silicon, an alloy material such as amorphous silicon carbide or amorphous silicon germanium, polycrystalline silicon or microcrystalline silicon partially containing amorphous silicon or its alloy material may be used. As required, the deposited first conductivity-type layer 111 may be irradiated with pulse laser light (laser annealing) to control the crystallinity and the carrier density.

Then, the photoelectric conversion layer 112 is deposited on the first conductivity-type layer 111. The photoelectric conversion layer 112 comprises substantially a non-doped intrinsic semiconductor. It may be an amorphous silicon-based or a crystalline (polycrystalline or microcrystalline) silicon-based. There is no particular limitation to a semiconductor material constituting the photoelectric conversion layer 112, and an alloy material such as silicon carbide or silicon germanium may be used. The thickness of the photoelectric conversion layer 112 is generally 0.3 to 0.4 $\mu$m in the case of an amorphous silicon-based and 0.5 to 20 $\mu$m in the case of a crystalline silicon-based to obtain a necessary and sufficient photoelectric conversion. As the crystalline (polycrystalline or microcrystalline) silicon-based photoelectric conversion layer, a layer of polycrystalline or microcrystalline silicon with an at least 80% crystallized volume fraction or a layer of weak p- or n-type crystalline silicon containing a small amount of impurity and having sufficient photoelectric conversion efficiency can be used.

On the photoelectric conversion layer 112, the opposite conductivity-type layer 113 is formed. The opposite conductivity-type layer 113 comprises, for example, an n-type silicon thin film which is doped with phosphorus as an conductivity determining impurity. However, there is no particular limitation to the impurity, and nitrogen or the like may be used in an n-type layer. Also, there is no particular limitation to the semiconductor materials for the opposite conductivity-type layer 113, and amorphous silicon, an alloy material such as amorphous silicon carbide or amorphous silicon germanium, polycrystalline silicon or microcrystalline silicon partially containing amorphous silicon or its alloy material may be used.

On the photovoltaic unit 11, a composite electrode 21 containing a back transparent conductive film 211 and a back metal electrode 212 is formed.

The functions of the back transparent conductive film 211 are to increase the adhesion strength of the back metal electrode 212 to the photovoltaic unit 11, to improve the reflecting efficiency of the back metal electrode 212 and to prevent the photovoltaic unit 11 from being chemically changed. The back transparent conductive film 211 is preferably formed of at least one material selected from transparent conductive oxides (TCO) such as ITO, $SnO_2$ and ZnO. A film comprising ZnO as a major component is particularly preferable. It is preferable that the thickness of the back transparent conductive film 211 comprising ZnO as a major component be 10 nm to 1 $\mu$m and the specific resistance be $1.5 \times 10^{-3}$ $\Omega$cm or less. Conventionally, in order to form a back transparent conductive film which meets such requirements, sputtering conditions of a pressure of $2 \times 10^{-2}$ Torr, a substrate temperature of 100 to 450° C. and a discharge power of 500 to 1500 mW/cm² has been adopted, as aforementioned. This, however, results in insufficient improvement in the photovoltaic characteristics.

In the present invention, the back transparent conductive film is formed by sputtering under a low damage condition, thereby suppressing a damage to the photovoltaic unit which is caused by negative ions (e.g., an O⁻ ion) produced during sputtering and reducing oxidation of the surface of the photo-voltaic unit. However, the low damage condition brings about the back transparent conductive film having impaired quality (resistance, transmittance) while the photovoltaic characteristics are not improved. In the present invention, an initial thin back transparent conductive film is formed on the surface of the photovoltaic unit under a low damage condition only in the initial stage and thereafter a main back transparent conductive film is formed under the condition ensuring that a high quality film can be obtained, thereby reducing a damage to the photovoltaic unit and improving the photovoltaic characteristics of a finally produced photovoltaic device.

Specific deposition methods for forming the back transparent conductive film by sputtering include the following methods (1) to (3).

(1) An initial back transparent conductive film is formed under a pressure of $2\times10^{-2}$ Torr or more for 1 to 30 seconds and thereafter the pressure is reduced to $\frac{1}{10}$ the pressure in the initial stage to form a main back transparent conductive film with the remainder thickness. In this method, the pressure in the second stage under which a high quality film is obtained is $2\times10^{-2}$ Torr or less and preferably of the order of $10^{-3}$ Torr.

(2) An initial back transparent conductive film is formed at a discharge power of 80 to 500 mW/cm$^2$ for 1 to 30 seconds and thereafter the discharge power is increased to 4 times the discharge power in the initial stage to form a main back transparent conductive film with the remainder thickness. In this method, the discharge power in the second stage at which a high quality film is obtained is 500 to 1500 mW/cm$^2$.

(3) An initial back transparent conductive film is formed at a deposition temperature (substrate temperature) of 100° C. or less for 1 to 30 seconds and thereafter the deposition temperature (substrate temperature) is raised to 100° C. or more to form a main back transparent conductive film with the remainder thickness. In this method, the temperature in the second stage at which a high quality film is obtained is 100 to 450° C. and preferably 100 to 300° C.

Using any one of the above methods, a film is formed under the initial condition (low damage condition) for 1 to 30 seconds to form an initial back transparent conductive film with a thickness of 1 to 10 nm. Since the sputtering conditions can easily be switched from the initial condition (low damage condition) to the second stage condition (high quality film-forming condition), there is no difference in the workability between the conventional manufacturing method and the manufacturing method of the present invention. It is needless to say that the back transparent conductive film may be formed in a combination of the above three methods.

The back metal electrode 212 may be formed by using a method such as vacuum deposition and sputtering. The back metal electrode 212 is preferably formed by using one metal selected from the group consisting of Ag, Au, Al, Cu and Pt or alloys containing these metals.

EXAMPLES

Examples of the present invention will be hereinafter explained.

Example 1

The amorphous silicon-based photovoltaic device shown in FIGURE was produced. Firstly, a transparent conductive film 2 comprising SnO$_2$ was formed on a glass substrate 1. On the transparent conductive film 2, an amorphous silicon-based photovoltaic unit 11 containing first conductivity-type layer (p-type layer) 111, an amorphous silicon-based photoelectric conversion layer (i-type layer) 112 and an opposite conductivity-type layer (n-type layer) 113 was formed by a plasma CVD method. On the photovoltaic unit 11, a composite electrode 21 consisting of a back transparent conductive film 211 comprising 90 nm-thick ZnO doped with Al and a back metal electrode 212 comprising Ag was formed by sputtering.

The above back transparent conductive film 211 was deposited by using RF magnetron sputtering under two-stage condition shown below. In this example, Ar gas was used as the sputtering gas and the temperature and the RF power density were not changed but kept at a constant temperature of 150° C. and a constant RF power density of 850 mW/cm$^2$, respectively. In the initial stage, sputtering was continued for 10 seconds under a chamber pressure of $1\times10^{-1}$ Torr to form an initial ZnO film with a thickness of about 2 nm. Then, the pressure was reduced to $3\times10^{-3}$ Torr to form a main ZnO film with the remainder thickness.

When the resulting photovoltaic device was irradiated with incident light of AM 1.5 at a light density of 100 mW/cm$^2$, photoelectric conversion efficiency was 11.3%.

Comparative Example 1

The photovoltaic device shown in FIGURE was manufactured in the same manner as in Example 1 except that the pressure was set at a constant chamber pressure of $3\times10^{-3}$ Torr when the back transparent conductive film 211 is formed by sputtering.

When the resulting photovoltaic device was irradiated with incident light of AM 1.5 at a light density of 100 mW/cm$^2$, photoelectric conversion efficiency was 8.8% which is lower than that of Example 1.

Example 2

The same procedures as in Example 1 were carried out, except that a back transparent conductive film 211 was formed under two-stage condition shown below. In this case, Ar gas was used as the sputtering gas and the substrate temperature and the chamber pressure were not changed but kept at a constant temperature of 150° C. and a constant pressure of $3\times10^{-3}$ Torr, respectively.

In the initial stage, sputtering was continued for 10 seconds at an RF power density of 200 mW/cm$^2$ to form an initial ZnO film with a thickness of about 2 nm. Then, the RF power density was raised to 850 mW/cm$^2$ to form a main ZnO film with the remainder thickness.

When the resulting photovoltaic device was irradiated with incident light of AM 1.5 at a light density of 100 mW/cm$^2$, photoelectric conversion efficiency was 11.1%.

Example 3

The same procedures as in Example 1 were carried out, except that a back transparent conductive film 211 was formed under two-stage condition shown below. In this case, Ar gas was used as the sputtering gas and the pressure and the RF power density were not changed but kept at a constant pressure of $3\times10^{-3}$ Torr and a constant RF power density of 850 mW/cm$^2$, respectively.

In the initial stage, sputtering was continued for 10 seconds at a substrate temperature of 50° C. to form an initial ZnO film with a thickness of about 2 nm. Then, the substrate temperature was raised to 150° C. to form a main ZnO film with the remainder thickness.

When the resulting photovoltaic device was irradiated with incident light of AM 1.5 at a light density of 100 mW/cm$^2$, photoelectric conversion efficiency was 11.0%.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a thin film photovoltaic device comprising successively forming a transparent conductive film, a thin film photovoltaic unit, and a back transparent conductive film and a back metal electrode on a substrate, wherein the back transparent conductive film is formed by sputtering comprising steps of forming an initial back transparent conductive film under a pressure of $5 \times 10^{-2}$ Torr or more for 1 to 30 seconds in an initial stage, and forming a main back transparent conductive film having the remainder thickness under a pressure reduced to $\frac{1}{10}$ the initial pressure or less in a second step.

2. The method according to claim 1, wherein the back transparent conductive film comprises ZnO as a major component.

3. The method according to claim 1, wherein the pressure in the second step is $2 \times 10^{-2}$ Torr or less.

4. The method according to claim 1, wherein a thickness of the initial back transparent conductive film formed in the initial stage is 1 to 10 nm and a total thickness of the back transparent conductive film is 10 nm to 1 μm.

5. The method according to claim 1, wherein the specific resistance of the back transparent conductive film is $1.5 \times 10^{-3}$ Ωcm or less.

6. The method according to claim 1, wherein the thin film photovoltaic unit has a structure in which a p-type, an i-type and an n-type amorphous silicon thin film are successively formed from the substrate side.

7. A method for manufacturing a thin film photovoltaic device comprising successively forming a transparent conductive film, a thin film photovoltaic unit, and a back transparent conductive film and a back metal electrode on a substrate, wherein the back transparent conductive film is formed by sputtering comprising steps of forming an initial back transparent conductive film at a temperature of 100° C. or less for 1 to 30 seconds in an initial stage and forming a main back transparent conductive film having the remainder thickness at a higher temperature of 100° C. or more in a second step.

8. The method according to claim 7, wherein the back transparent conductive film comprises ZnO as a major component.

9. The method according to claim 7, wherein the temperature in the second step is 100 to 450° C.

10. The method according to claim 9, wherein the temperature in the second step is 100 to 300° C.

11. The method according to claim 7, wherein a thickness of the initial back transparent conductive film formed in the initial stage is 1 to 10 nm and a total thickness of the back transparent conductive film is 10 nm to 1 μm.

12. The method according to claim 7, wherein a specific resistance of the back transparent conductive film is $1.5 \times 10^{-3}$ Ωcm or less.

13. The method according to claim 7, wherein the thin film photovoltaic unit has a structure in which a p-type, an i-type and an n-type amorphous silicon thin film are successively formed from the substrate side.

* * * * *